(12) United States Patent
Chang et al.

(10) Patent No.: US 11,736,052 B2
(45) Date of Patent: Aug. 22, 2023

(54) FAN CONTROL CIRCUIT WITH TEMPERATURE COMPENSATION AND METHOD OF CONTROLLING FAN

(71) Applicant: ENERMAX TECHNOLOGY CORPORATION, Taoyuan (TW)

(72) Inventors: Chin-Yun Chang, Taoyuan (TW); Chien-Kuei Hsu, Taoyuan (TW)

(73) Assignee: ENERMAX TECHNOLOGY CORPORATION, Taoyuan (TW)

( * ) Notice: Subject to any disclaimer, the term of this patent is extended or adjusted under 35 U.S.C. 154(b) by 67 days.

(21) Appl. No.: 17/218,091

(22) Filed: Mar. 30, 2021

(65) Prior Publication Data
US 2021/0315129 A1 Oct. 7, 2021

(30) Foreign Application Priority Data
Apr. 1, 2020 (TW) .................... 109111234

(51) Int. Cl.
*H02P 27/02* (2016.01)
*G01K 7/34* (2006.01)
*H02P 7/28* (2016.01)
*H05K 7/20* (2006.01)

(52) U.S. Cl.
CPC ............ *H02P 27/026* (2013.01); *G01K 7/346* (2013.01); *H02P 7/2805* (2013.01); *H05K 7/20209* (2013.01)

(58) Field of Classification Search
CPC .............................. H02P 27/026; H02P 7/2805
USPC .......................................................... 318/471
See application file for complete search history.

(56) References Cited

U.S. PATENT DOCUMENTS

2009/0167228 A1\* 7/2009 Chung ................. F04D 27/004
  318/473
2017/0102744 A1\* 4/2017 Haley ..................... G06F 1/206
2017/0353132 A1\* 12/2017 Qin ........................ H02K 11/33

FOREIGN PATENT DOCUMENTS

CN 103671180 A 3/2014
TW 527097 U 4/2003

OTHER PUBLICATIONS

Office Action dated Dec. 14, 2022 of the corresponding China patent application No. 202110231111.3.

\* cited by examiner

*Primary Examiner* — Kawing Chan
(74) *Attorney, Agent, or Firm* — Chun-Ming Shih; HDLS IPR Services (57) ABSTRACT

A fan control circuit with temperature compensation includes an on-off unit and a speed adjustment unit. When determining that a loading is greater than or equal to an adjustable start threshold according to a load signal, the on-off unit controls the fan entering a working mode. In the working mode and determining that the loading is less than a speed-adjusting threshold, the on-off unit maintains a speed value of the fan at a first fixed speed. When determining the loading is greater than or equal to the speed-adjusting threshold, the speed adjustment unit adjusts the speed value according to the loading. The speed adjustment unit generates a speed displacement according to a temperature signal to compensate the speed value.

12 Claims, 5 Drawing Sheets

FAN CONTROL CIRCUIT WITH TEMPERATURE COMPENSATION AND METHOD OF CONTROLLING FAN

BACKGROUND

Technical Field

The present disclosure relates to a fan control circuit with temperature compensation and a method of controlling a fan, and more particularly to a fan control circuit with temperature compensation and a method of controlling a fan based on changes in loading and temperature.

Description of Related Art

The statements in this section merely provide background information related to the present disclosure and do not necessarily constitute prior art.

In today's electronic device, since more and more attention is paid to the energy with high power density and high processing efficiency, there is more and more attention to the demand for the heat dissipation capability of the electronic device. In order to increase the heat dissipation capability of the electronic device, fans are usually used to dissipate heat from the electronic devices.

However, due to the low heat generated by the electronic device in the standby state, the demand for the heat dissipation capability of the electronic device is not high, the fan is usually controlled to run at a low speed when the electronic device is in the standby state or the loading is not large. When the heat generated by the electronic device is high, the better heat dissipation capability is provided by increasing the speed of the fan.

The manner for controlling the heat dissipation of the electronic device by the fan is usually to adjust the speed of the fan by detecting the temperature of the electronic device. When the temperature of the electronic device is low, the fan uses a low speed to dissipate heat for the electronic device; when the temperature of the electronic device is high, the fan uses a high speed to dissipate heat for the electronic device. However, the use of detecting the temperature of the electronic device to control the fan will often cause lagging the temperature increasing and delaying the fan speed increasing at the moment of the increased loading. As a result, the fan cannot provide optimal heat dissipation capability in time.

Therefore, the present disclosure provides a fan control circuit with temperature compensation and a method of controlling the fan to control the speed value of the fan by the change of the loading and adjust the speed value of the fan by the temperature compensation according to the change of the temperature.

SUMMARY

In order to solve the above-mentioned problems, a fan control circuit with temperature compensation is provided. The fan control circuit with temperature compensation includes an on-off unit and a speed adjustment unit. The on-off unit is coupled to a fan, and the on-off unit receives a load signal corresponding to a loading of a load. The speed adjustment unit is coupled to the fan, and the speed adjustment unit receives the load signal and a temperature signal corresponding to a temperature of the load. The on-off unit sets an adjustable start threshold, and determines that the loading is greater than or equal to the adjustable start threshold according to the load signal to control the fan entering a working mode. In the working mode and when the on-off unit determines that the loading is less than a speed-adjusting threshold, the on-off unit controls the fan entering a fixed-speed mode and maintains a speed value of the fan at a first fixed speed. When the speed adjustment unit determines that the loading is greater than or equal to the speed-adjusting threshold, the speed adjustment unit controls the fan entering a speed-adjusting mode, and the speed adjustment unit adjusts the speed value according to the loading. The speed adjustment unit generates a speed displacement according to the temperature signal, and provides the speed displacement to compensate the speed value when the fan enters the working mode.

In one embodiment, the speed adjustment unit sets the speed-adjusting threshold to be a first speed-adjusting threshold, and displaces the speed-adjusting threshold to be a second speed-adjusting threshold according to the speed displacement. In the fixed-speed mode, the speed adjustment unit adjusts the speed value to be a second fixed speed according to the speed displacement. When the speed value is the second fixed speed and the temperature meets the second speed-adjusting threshold, the speed adjustment unit controls the fan entering the speed-adjusting mode.

In one embodiment, the speed adjustment unit sets the speed-adjusting threshold to be a first speed-adjusting threshold, and displaces the speed-adjusting threshold to be a second speed-adjusting threshold according to the speed displacement. When the fan enters the fixed-speed mode and the temperature meets the second speed-adjusting threshold, the speed adjustment unit controls the fan entering the speed-adjusting mode.

In one embodiment, the on-off unit includes a start unit and a switch unit. The start circuit receives the load signal and a start signal. The switch unit is coupled to the start circuit and the fan. The start circuit determines whether the loading is greater than or equal to the adjustable start threshold to provide a first control signal according to the load signal and the start signal. The switch unit is turned on or turned off by the first control signal to control the fan entering the working mode.

In one embodiment, the speed adjustment unit includes a temperature compensation circuit, a speed adjustment circuit, and a transistor. The temperature compensation circuit receives the load signal and the temperature signal. The speed adjustment circuit is coupled to the temperature compensation circuit. The transistor is coupled to the temperature compensation circuit and the fan. The temperature compensation circuit provides a compensation value to compensate the load signal to be a second control signal according to the temperature signal, the speed adjustment circuit provides a drive signal to the transistor according to the second control signal, and the transistor adjusts the speed value of the fan according to the drive signal.

In one embodiment, the on-off unit further includes a hysteresis unit. The hysteresis unit is coupled to the start circuit and the switch unit. The hysteresis unit provides a hysteresis signal to the switch unit according to the first control signal. The hysteresis signal controls the switch unit to be turned on when the loading is greater than or equal to a start point of the adjustable start threshold so as to control the fan entering the working mode, and hysteresis signal controls the switch unit to be turned off when the loading is less than a shutdown point of the adjustable start threshold so as to control the fan entering a standby mode.

In one embodiment, the fan control circuit controls the speed value through a control signal, and the control signal is a PWM (pulse-width modulation) signal. In the fixed-speed mode, the start unit controls the control signal to be the PWM signal with a fixed frequency and a fixed duty cycle to maintain the speed value at the first fixed speed. In the speed-adjusting mode, the speed adjustment unit adjusts the frequency or the duty cycle of the PWM signal according to the loading to adjust the speed value.

In one embodiment, the fan control circuit controls the speed value through a control signal, and the control signal is a voltage. In the fixed-speed mode, the start unit controls the voltage to be a fixed voltage to maintain the speed value at the fixed speed. In the speed-adjusting mode, the speed adjustment unit adjusts the voltage according to the loading to adjust the speed value.

In one embodiment, the on-off unit sets the adjustable start threshold through a threshold setting unit, and the threshold setting unit is one of a variable resistor, a precision variable resistor, a multi-decade voltage divider circuit, a multi-decade comparison circuit, a multi-decade touch switch, a dip switch, and a microcontroller.

In order to solve the above-mentioned problems, a method of controlling a fan with temperature compensation is provided. The method includes steps of: realizing a loading of a load according to a load signal, and realizing a temperature of the load according to a temperature signal, setting an adjustable start threshold, and determining that the loading is greater than or equal to the adjustable start threshold to control a fan entering a working mode, controlling the fan entering a fixed-speed mode, and maintaining a speed value of the fan to be at a first fixed speed when in the working mode and the loading is less than a speed-adjusting threshold, controlling the fan entering a speed-adjusting mode, and adjusting the speed value according to the loading when in the working mode and the loading is greater than or equal to the speed-adjusting threshold, and setting a speed displacement according to the temperature, and providing the speed displacement to compensate the speed value when the fan enters the working mode.

In one embodiment, the method further includes steps of: setting the speed-adjusting threshold to be a first speed-adjusting threshold, adjusting the speed value to be a second fixed speed according to the speed displacement in the fixed-speed mode, and adjusting the speed value according to the loading, and displacing the speed value according to the speed displacement in the speed-adjusting mode.

In one embodiment, the method further includes steps of: setting the speed-adjusting threshold to be a first speed-adjusting threshold, and displacing the speed-adjusting threshold to be a second speed-adjusting threshold according to the speed displacement, and controlling the fan entering the speed-adjusting mode when the fan enters the fixed-speed mode and the temperature meets the second speed-adjusting threshold.

In one embodiment, the method further includes steps of: controlling the fan entering the working mode when the loading is greater than or equal to a start point of the adjustable start threshold, and controlling the fan entering a standby mode when the loading is less than a shutdown point of the adjustable start threshold.

In one embodiment, a control signal for controlling the speed value is a pulse width modulation (PWM) signal, and the method includes steps of: controlling the control signal to be the PWM signal with a fixed frequency and a fixed duty cycle to maintain the speed value at the first fixed speed in the fixed-speed mode, and adjusting the frequency or the duty cycle of the PWM signal according to the loading to adjust the speed value in the speed-adjusting mode.

In one embodiment, a control signal for controlling the speed value is a voltage, and the method includes steps of: controlling the voltage to be a fixed voltage to maintain the speed value at the first fixed speed in the fixed-speed mode, and adjusting the voltage to adjust speed value according to the loading in the speed-adjusting mode.

The main purpose and effect of the present disclosure is to use the loading change of the load to correspondingly control the speed of the fan, and use the temperature change of the load to correspondingly displace the speed displacement. Compared with the change of operating temperature, the present disclosure can predict the load temperature in advance and provide the heat dissipation capability in advance, and provide corresponding temperature compensation to significantly increase the heat dissipation capability.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWINGS

The present disclosure can be more fully understood by reading the following detailed description of the embodiment, with reference made to the accompanying drawing as follows.

DETAILED DESCRIPTION

Reference will now be made to the drawing figures to describe the present disclosure in detail. It will be understood that the drawing figures and exemplified embodiments of present disclosure are not limited to the details thereof.

Figure 1:
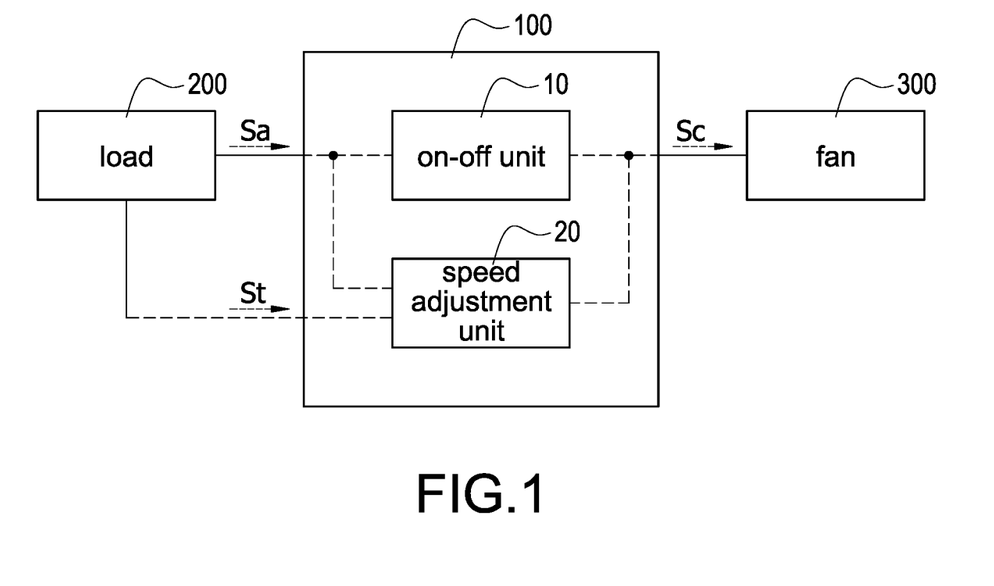
FIG. 1 is a block circuit diagram of a fan control circuit with temperature compensation according to the present disclosure.

Please refer to FIG. 1, which shows a block circuit diagram of a fan control circuit with temperature compensation according to the present disclosure. The fan control circuit 100 is coupled to a load 200 and an electric fan 300 (hereinafter referred to as "fan 300"). The rotation speed (hereinafter referred to as "speed") of the fan 300 is adjusted according to conditions of the load 200 so as to provide heat dissipation to the load 200. The fan control circuit 100 includes an on-off unit 10 and a speed adjustment unit 20. The on-off unit 10 receives a load signal Sa corresponding to the loading of the load 200. In particular, the light loading or heavy loading will be reflected in a value of the load signal Sa. The speed adjustment unit 20 receives the load signal Sa and a temperature signal St corresponding to the temperature of the load 200. In particular, the high temperature or low temperature will be reflected in a value of the temperature signal St. In some embodiments, the load 200 may be a physical apparatus, such as an electronic circuit (such as a main board), an electronic device (such as a server), a power supply device, and so on.

The fan control circuit 100 controls operation modes of the fan 300 according to conditions of the load 200. When the fan control circuit 100 is driven but the fan 300 does not operate, it is called a standby mode, and conversely is called a working mode. In the working mode and a speed value of the fan 300 is fixed and low, it is called a fixed-speed mode. When the speed of the fan 300 is adjusted according to conditions of the load 200, it is called a speed-adjusting mode, and when the speed of the fan 300 reaches an upper limit, it is called a full-speed mode. The on-off unit 10 sets an adjustable start threshold, and when determining the loading is greater than or equal to the adjustable start threshold according to the load signal Sa, the on-off unit 10 controls the fan 300 operating from the standby mode to the working mode so that the fan 300 starts to be driven. When the fan 300 is in the working mode and the on-off unit 10 determines that the loading is less than a speed-adjusting threshold, it means that the load 200 is still in the light load condition set by the fan control circuit 100. At this condition, the on-off unit 10 controls the fan 300 entering the fixed-speed mode. In the fixed-speed mode, the on-off unit 10 maintains the speed value of the fan 300 at a first fixed speed with a lower speed value so that the fan control circuit 100 can control the fan 300 to provide the basic heat dissipation capability when the load 200 is in the light load condition.

When the fan 300 is in the working mode and the speed adjustment unit 20 determines that the loading is greater than or equal to the speed-adjusting threshold, it means that load 200 has deviated from the light load condition set by the fan control circuit 100, and it needs to start to increase the heat dissipation capability. At this condition, the speed adjustment unit 20 controls the fan 300 entering the speed-adjusting mode. In the speed-adjusting mode, the speed adjustment unit 20 adjusts the speed value of the fan 300 according to the loading so that the fan 300 is controlled to provide corresponding heat dissipation capability in response to changes in loading. Finally, when the loading has increased to the upper limit of the speed value of the fan 300, the fan 300 enters the full-speed mode. At this condition, the speed adjustment unit 20 controls the speed value of the fan 300 to be at an upper limit value to provide the optimal heat dissipation capability for the load 200. When the fan 300 operates in the working mode, the fan control circuit 100 provides a temperature compensation mechanism to increase or decrease the heat dissipation capability in response to changes in the temperature of the load 200. Specifically, the speed adjustment unit 20 sets a speed displacement according to the temperature of the load 200, realizes the temperature change of the load 200 by using the temperature signal St, and generates the change of the speed displacement according to the change of the temperature signal St. When the fan 300 enters the working mode, the speed adjustment unit 20 provides the speed displacement to compensate the speed value. When the temperature is higher, the speed adjustment unit 20 compensates more speed displacement to increase the speed value. On the contrary, when the temperature is lower, the speed adjustment unit 20 compensates less speed displacement to decrease the speed value.

In one embodiment, the fan control circuit 100 is a self-design circuit by electronic components, such as general purpose components (such as resistors, capacitors, or so on) or integrated circuit components (such as packaged analog controllers). In addition, the fan control circuit 100 may be a microcontroller controlled by software or firmware. When the fan control circuit 100 is the self-design circuit by electronic components, a control signal Sc that controls the speed value of the fan 300 is in a voltage form, and the fan control circuit 100 adjusts the speed value of the fan 300 by adjusting an amplitude of the voltage. When the fan control circuit 100 is the microcontroller controlled by software or firmware, the control signal Sc that controls the speed value of the fan 300 is a PWM (pulse-width modulation) form, and the fan control circuit 100 adjusts the speed value of the fan 300 by adjusting the width (or frequency) of the PWM signal.

According to the type of the fan control circuit 100, the on-off unit 10 may set the adjustable start threshold by software, hardware, or firmware according to the type thereof. In the hardware, the on-off unit 10 may use, for example but not limited to, a (precision) variable resistor, a multi-decade voltage divider circuit (such as a resistor voltage divider), a multi-decade touch switch, a dip switch, or a multi-decade comparison circuit, to set the adjustable start threshold. In the software or firmware, the on-off unit 10 may use the specified parameters to write the adjustable start threshold into the microcontroller.

Since the increased loading of the load 200 will cause the temperature of the load 200 to increase but the temperature has not yet increase at the moment of the increased loading, the temperature changes of the load 200 will lag behind the change of the loading. The main purpose and effect of the present disclosure is to use the loading change of the load to correspondingly control the speed of the fan 300. Compared with the change of operating temperature, the present disclosure can predict the load temperature of the load 200 in advance and provide the heat dissipation capability in advance. In addition, since the actual working environment of the load 200 is different, its working environment will affect the actual temperature of the load 200. Therefore, the present disclosure uses the actual temperature of the load 200 to detect the actual temperature of the load 200 to provide a corresponding temperature for compensating the speed value, which can significantly increase the heat dissipation capability.

Figure 2A:
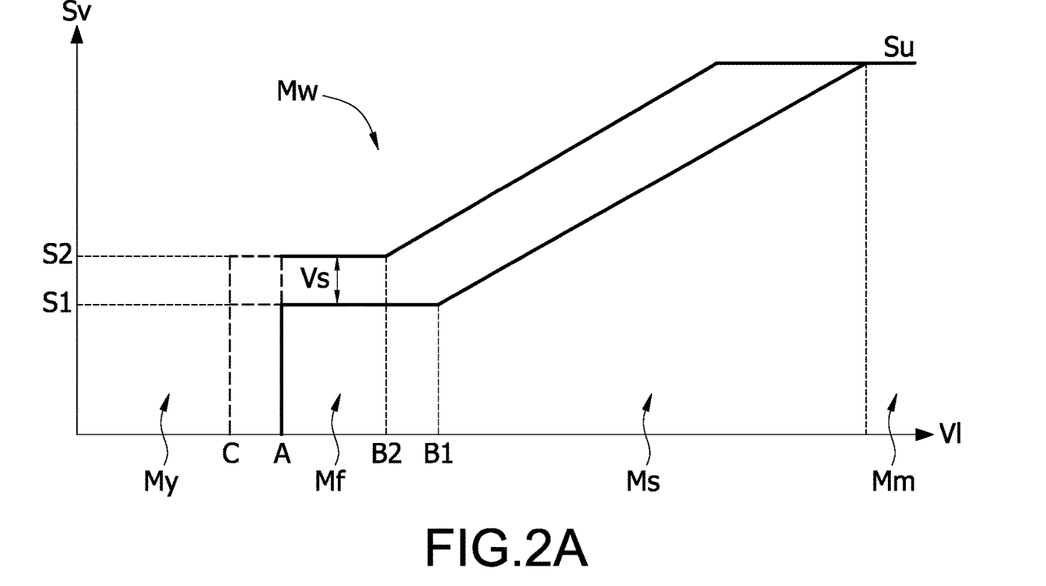
FIG. 2A is a curve diagram of a speed value of the fan control circuit with temperature compensation according to a first embodiment of the present disclosure.
Figure 2B:
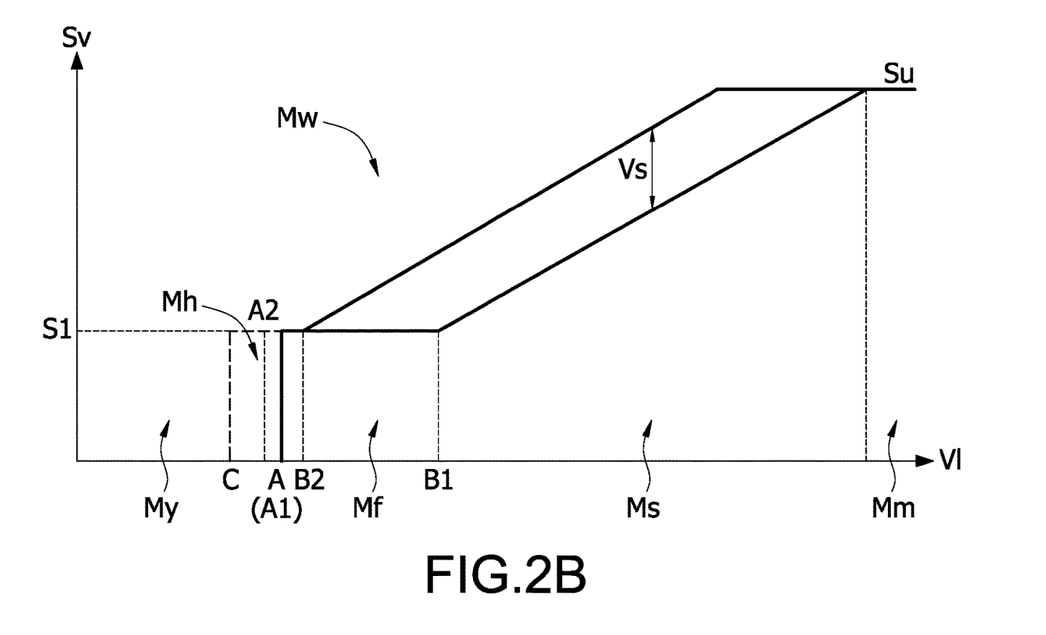
FIG. 2B is a curve diagram of the speed value of the fan control circuit with temperature compensation according to a second embodiment of the present disclosure.

Please refer to FIG. 2A and FIG. 2B, which respectively shows curve diagrams of a speed value of the fan control circuit with temperature compensation according to a first embodiment and a second embodiment of the present disclosure, and also refer to FIG. 1. In FIG. 2A, the on-off unit 10 sets adjustable start thresholds A-C for starting the fan 300. When the loading V1 is greater than or equal to the adjustable start thresholds A-C, the on-off unit 10 starts the fan 300 so that the fan 300 enters the fixed-speed mode Mf of the working mode Mw. The adjustable start thresholds A-C may be manually set by the operator, or automatically set by the fan control circuit 100 according to a predetermined loading condition acquired by communicating with the load 200. At this condition, a speed value Sv of the fan 300 is maintained at a first fixed speed S1. Afterward, the speed adjustment unit 20 sets the speed-adjusting threshold to be the first speed-adjusting threshold B1 according to the time point when the loading departs from the light load. When the loading V1 is less than the first speed-adjusting threshold B1, the on-off unit 10 maintains the speed value Sv of the fan 300 at the first fixed speed S1. When the loading V1 is greater than the first speed-adjusting threshold B1, the speed adjustment unit 20 controls the fan 300 entering the speed-adjusting mode Ms. When the fan 300 enters the speed-adjusting mode Ms, the speed adjustment unit 20 adjusts the speed value Sv according to the loading V1. Finally, when the loading V1 has increased to an upper limit value Su of the speed value Sv of the fan 300, the fan 300 enters the full-speed mode Mm.

When the fan 300 enters the working mode Mw, the speed adjustment unit 20 sets a speed displacement Vs according a temperature of the load 200. The change of the speed displacement Vs corresponds to the change of the temperature of the load 200, and the speed adjustment unit 20 provides the speed displacement Vs to compensate the speed value Sv. In the fixed-speed mode Mf, the speed adjustment unit 20 adjusts the speed value Sv to be a second fixed speed S2 according to the speed displacement Vs. In addition, the speed adjustment unit 20 displaces the speed-adjusting threshold to be a second speed-adjusting threshold B2 according to the speed displacement Vs. Since the speed-adjusting threshold is displaced according to the speed displacement Vs corresponding to the temperature of the load 200, the fan 300 will earlier or later enter the speed-adjusting mode Ms. In this embodiment, due to the increase in temperature, the point of the first speed-adjusting threshold B1 is advanced to the point of the second speed-adjusting threshold B2 so as to provide a better dissipation ability in advance in response to the increase in temperature.

For example, it is assumed that the temperature of the load 200 is 20 degrees Celsius, and the speed value Sv of the fan 300 is maintained at the first fixed speed S1 and the fan 300 enters the speed-adjusting mode Ms from the first speed-adjusting threshold B1. It is assumed that the temperature of the load 200 is 30 degrees Celsius, and the speed value Sv of the fan 300 is maintained at the second fixed speed S2 and the fan 300 enters the speed-adjusting mode Ms from the second speed-adjusting threshold B2. When the fan control circuit 100 realizes that the loading V1 of the load 200 is the light load according to the load signal Sa, the on-off unit 10 starts (activates) the fan 300 to control the fan 300 entering the fixed-speed mode Mf. In the fixed-speed mode Mf, the speed adjustment unit 20 realizes the temperature of the load 200 according to the temperature signal St. When the loading V1 is continuously increased and the temperature of the load 200 is below 20 degrees Celsius, the speed adjustment unit 20 controls the speed value Sv of the fan 300 to be maintained at the first fixed speed S1, and controls the fan 300 entering the speed-adjusting mode Ms at the first speed-adjusting threshold B1. When the loading V1 is continuously increased and the speed adjustment unit 20 realizes that the temperature of the load 200 reaches 30 degrees Celsius, the speed adjustment unit 20 controls the speed value Sv of the fan 300 to be maintained at the second fixed speed S2, and controls the fan 300 entering the speed-adjusting mode Ms at the second speed-adjusting threshold B2 in advance.

In the speed-adjusting mode Ms, the speed adjustment unit 20 adjusts the speed value Sv according to the loading V1, and displaces the speed value Sv according to the speed displacement Vs. By the compensation of the speed displacement Vs according to the temperature of the load 200 by the speed adjustment unit 20 in the fixed-speed mode Mf and the speed-adjusting mode Ms, the heat dissipation capability of the load 200 by the fan 300 is increased. That is, in the speed-adjusting mode Ms and the loading V1 is continuously increased, if the temperature changes, the increase of the speed value Sv is not with a fixed slope but a non-linear curve. Finally, when the loading V1 is less than the adjustable start thresholds A-C, the on-off unit 10 turns off the fan 300 so that the fan 300 is in a standby mode My.

As shown in FIG. 2B, the curve of the speed value Sv of the fan 300 in the working mode Mw is the same as that of the FIG. 2A, and the difference is the compensation manner of the speed displacement Vs. Specifically, in the fixed-speed mode Mf of this embodiment, the speed value Sv of the fan 300 is always maintained at the first fixed speed S1. The speed adjustment unit 20 sets the speed-adjusting threshold to be the first speed-adjusting threshold B1 according to the time point when the loading departs from the light load and displaces the speed-adjusting threshold to be the second speed-adjusting threshold B2 according to the speed displacement Vs. At this condition, the speed value Sv is still at the first fixed speed S1. Since the speed-adjusting threshold is displaced according to the speed displacement Vs corresponding to the temperature of the load 200, the fan 300 will earlier or later enter the speed-adjusting mode Ms. For example, it is assumed that the temperature of the load 200 is 20 degrees Celsius, and the fan 300 enters the speed-adjusting mode Ms from the first speed-adjusting threshold B1, and the speed value Sv is adjusted upwards from the first fixed speed S1. It is assumed that the temperature of the load 200 is 30 degrees Celsius, and the fan 300 enters the speed-adjusting mode Ms from the second speed-adjusting threshold B2, and the speed value Sv is still adjusted from the first fixed speed S1. When the fan control circuit 100 realizes that the loading V1 of the load 200 is the light load according to the load signal Sa, the on-off unit 10 starts (activates) the fan 300 to control the fan 300 entering the fixed-speed mode Mf. In the fixed-speed mode Mf, the speed adjustment unit 20 realizes the temperature of the load 200 according to the temperature signal St. When the loading V1 is continuously increased and the temperature of the load 200 is below 20 degrees Celsius, the speed adjustment unit 20 controls the fan 300 entering the speed-adjusting mode Ms at the first speed-adjusting threshold B1. When the loading V1 is continuously increased and the speed adjustment unit 20 realizes that the temperature of the load 200 reaches 30 degrees Celsius, the speed adjustment unit 20 controls the fan 300 entering the speed-adjusting mode Ms at the second speed-adjusting threshold B2 in advance.

The speed control modes of the fan 300 further includes a hysteresis mode Mh. The hysteresis mode Mh is provided to avoid the reciprocating rise and fall of the loading V1, which causes the fan 300 to be repeatedly turned on and turned off when the loading V1 of the fan 300 is near the adjustable start thresholds A-C. Therefore, the fan control circuit 100 sets the adjustable start threshold A1 (i.e., the position of the point A) to be a start (activation) point and the adjustable start threshold A2 to be a shutdown point. The loading V1 corresponding to the shutdown point A2 is lower than the loading V1 corresponding to the start point A1. After the on-off unit 10 starts the fan 300 to make the fan 300 enter the working mode Mw, if the loading V1 returns to the start point A1, the fan control circuit 100 does not control the fan 300 to stop and without entering the standby mode My. Until the loading V1 reduces to the shutdown point A2, the fan control circuit 100 controls the fan 300 to stop and to enter the standby mode My. Therefore, it can avoid repeatedly turning on and turning off the fan to easily damage the fan 300. Since the speed curves shown in FIG. 2A and FIG. 2B will be displaced according to the speed displacement Vs corresponding to the temperature of the load 200 to produce the effect of shifting the speed curves shown in FIG. 2A and FIG. 2B, the corresponding heat dissipation capability is increased by the speed curve shift when the temperature becomes higher. In addition, the hysteresis mode Mh may be also applied to the embodiment of FIG. 2A, and the detailed hysteresis control manner may be disclosed with FIG. 2B, and the detail description is omitted here for conciseness.

Figure 3A:
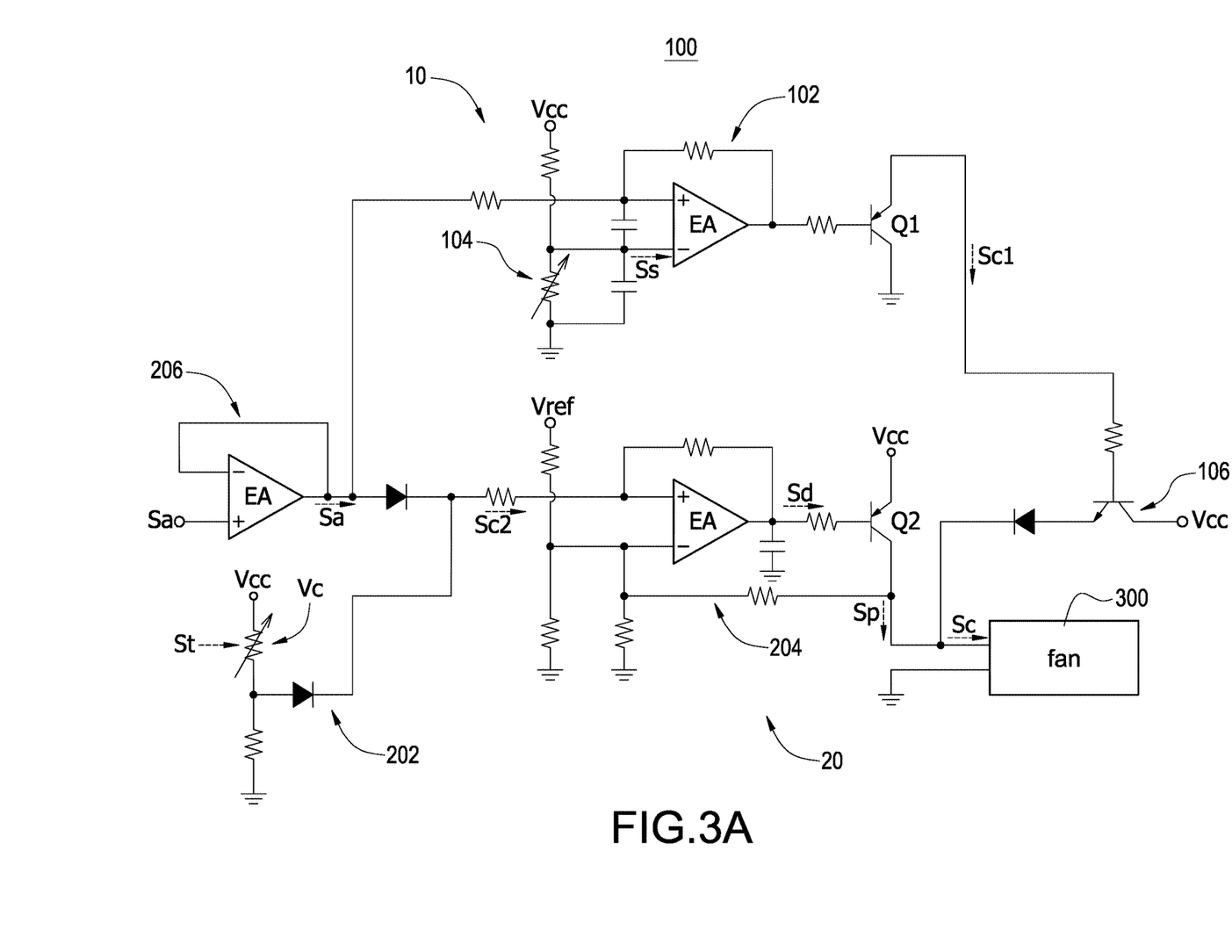
FIG. 3A is a circuit diagram of the fan control circuit with temperature compensation according to a first embodiment of the present disclosure.

Please refer to FIG. 3A, which shows a circuit diagram of the fan control circuit with temperature compensation according to a first embodiment of the present disclosure, and also refer to FIG. 1 to FIG. 2B. In this embodiment, the fan control circuit 100 is a self-design circuit by electronic components, such as general purpose components or integrated circuit components. The on-off unit 10 includes a start circuit 102, a threshold setting unit 104, and a switch unit 106. The start circuit 102 is coupled to the threshold setting unit 104 and the switch unit 106. The start circuit 102 determines whether the loading V1 is greater than or equal to the adjustable start thresholds A-C to provide a first control signal Sc1 to the switch unit 106 according to the load signal Sa and a start signal Ss provided by the threshold setting unit 104. The switch unit 106 is turned on or turned off according to the first control signal Sc1 to control the speed value Sv of the fan 300. In one embodiment, the threshold setting unit 104 may be, for example but not limited to, an adjustable resistor (shown in FIG. 3A), a touch switch, a multi-decade voltage divider circuit, or a microcontroller. The parameters or states set by the threshold setting unit 104 are the points of the adjustable start thresholds A-C shown in FIG. 2A or FIG. 2B.

Specifically, when the threshold setting unit 104 is a variable resistor, the adjustable start thresholds A-C may be set by adjusting the resistance of the variable resistor. The start circuit 102 may be composed by an error amplifier EA and a first transistor Q1, and the error amplifier EA is coupled to the first transistor Q1. The error amplifier EA receives the load signal Sa corresponding to the loading V1 and the start signal Ss represented by the adjustable start thresholds A-C (i.e., the signal values are corresponding to the adjustable start thresholds A-C). The first transistor Q1 is controlled according to the load signal Sa and the start signal Ss so that the first transistor Q1 provides the first control signal Sc1 to the switch unit 106. The switch unit 106 is coupled to the first transistor Q1, the speed adjustment unit 20, and the fan 300. When the switch unit 106 is turned on by the first control signal Sc1, an input end of the fan 300 receives a working voltage Vcc so as to control the speed value Sv of the fan 300 at the first fixed speed S1 and control the fan 300 entering the fixed-speed mode Mf of the working mode Mw. On the contrary, when the switch unit 106 is turned off by the first control signal Sc1, the fan 300 is not yet operating and is in the standby mode My.

The speed adjustment unit 20 includes a temperature compensation circuit 202, a speed adjustment circuit 204, and a second transistor Q2. The speed adjustment circuit 204 is coupled to the temperature compensation circuit 202 and the second transistor Q2, and the second transistor Q2 is coupled to the fan 300. The temperature compensation circuit 202 provides a compensation value Vc to compensate the load signal Sa to be the second control signal Sc2 according to the temperature signal St. The temperature compensation circuit 202 receives the second control signal Sc2 and the reference voltage Vref. The threshold setting unit 104, which is used to provide the compensation value Vc, may be an adjustable resistor, a touch switch, a multi-decade voltage divider circuit, or a microcontroller. The temperature compensation circuit 202 provides a drive signal Sd to the second transistor Q2 according to the second control signal Sc2 and the reference voltage Vref so that the second transistor Q2 adjusts the voltage of a speed signal Sp, that is, the second transistor Q2 is not only used as a switch. When the voltage of the speed signal Sp exceeds the voltage when the switch unit 106 is turned on, the fan 300 enters the speed-adjusting mode Ms of the working mode Mw. At this condition, the speed value Sv of the fan 300 changes according to the voltage of the speed signal Sp. Therefore, in addition to adjusting the speed value Sv of the fan 300 according to the loading V1, the speed adjustment unit 20 also provides the speed displacement Vs according to the compensation value Vc corresponding to the temperature. That is, the speed signal Sp directly reflects the loading V1 plus a final signal after the temperature compensation. In particular, the control signal Sc shown in FIG. 1 may represent the working voltage Vcc and the speed signal Sp shown in FIG. 3A.

Specifically, the temperature compensation circuit 202 includes a thermistor, which is a type of resistor whose resistance is strongly dependent on temperature. By the change of the negative temperature coefficient (NTC) of the thermistor, the temperature compensation circuit 202 provides the compensation value Vc to compensate the load signal Sa. In particular, the magnitude of the compensation value Vc corresponds to the magnitude of the speed displacement Vs. The speed adjustment circuit 204 is an amplifier circuit composed of the error amplifier EA, and the error amplifier EA is coupled to the second transistor Q2. The error amplifier EA receives the second control signal Sc2 and the reference voltage Vref, and provides the drive signal Sd to control the second transistor Q2 according to the second control signal Sc2 and the reference voltage Vref so that the second transistor Q2 provides the speed signal Sp controlled by the drive signal Sd to the fan 300. The manner in which the on-off unit 10 and the speed adjustment unit 20 control the fan 300 is similar to the concept of logic gate "OR". When the switch unit 106 is turned on by the first control signal Sc1, the input end of the fan 300 receives the working voltage Vcc to control the speed value Sv of the fan 300 to be at the first fixed speed S1. When the voltage of the speed signal Sp exceeds the working voltage Vcc, the speed value Sv of the fan 300 is controlled by the speed signal Sp. In particular, the curve diagram of the embodiment in FIG. 2A may be implemented using the fan control circuit 100 of FIG. 3A.

The speed adjustment unit 20 further includes a voltage follower unit 206. The voltage follower unit 206 is coupled to the temperature compensation circuit 202 and receives the load signal Sa. The voltage follower unit 206 has a very high input impedance and a very small output impedance so that the voltage follower unit 206 can isolate the power stage (such as the fan 300 or the drive circuit of driving the fan 300) and the small signal stage (such as the fan control circuit 100). Therefore, the load signal Sa provided to the fan control circuit 100 will not be distorted due to the influence of the large power of the power stage, thereby increasing the accuracy of the fan control circuit 100 in determining the loading V1.

In one embodiment, the on-off unit 10 and the speed adjustment unit 20 may respectively include a first unidirectional conduction component D1 and a second unidirectional conduction component D2. The first unidirectional conduction component D1 is coupled to the switch unit 106 and the fan 300, and the second unidirectional conduction component D2 is coupled to the second transistor Q2 and the fan 300. The first unidirectional conduction component D1 and the second unidirectional conduction component D2 may be an electronic component with forward bias in one direction and reverse bias in the opposite direction, such as a diode, a thyristor, or so on. The first unidirectional conduction component D1 is used to prevent the electric power from being reversely fed back to the on-off unit 10 when the voltage of the speed signal Sp exceeds the working voltage Vcc, thereby causing the failure of the on-off unit 10. Similarly, the function of the second unidirectional conduction component D2 is also the same. In one embodiment, the internal circuits of the start circuit 102, the threshold setting unit 104, the switch unit 106, the temperature compensation circuit 202, and the speed adjustment circuit 204 are not limited to the structure shown in FIG. 3A. Any structure of circuit, software, or firmware that can implement the control manner of each unit mentioned above should be included in the scope of this embodiment.

Figure 3B:
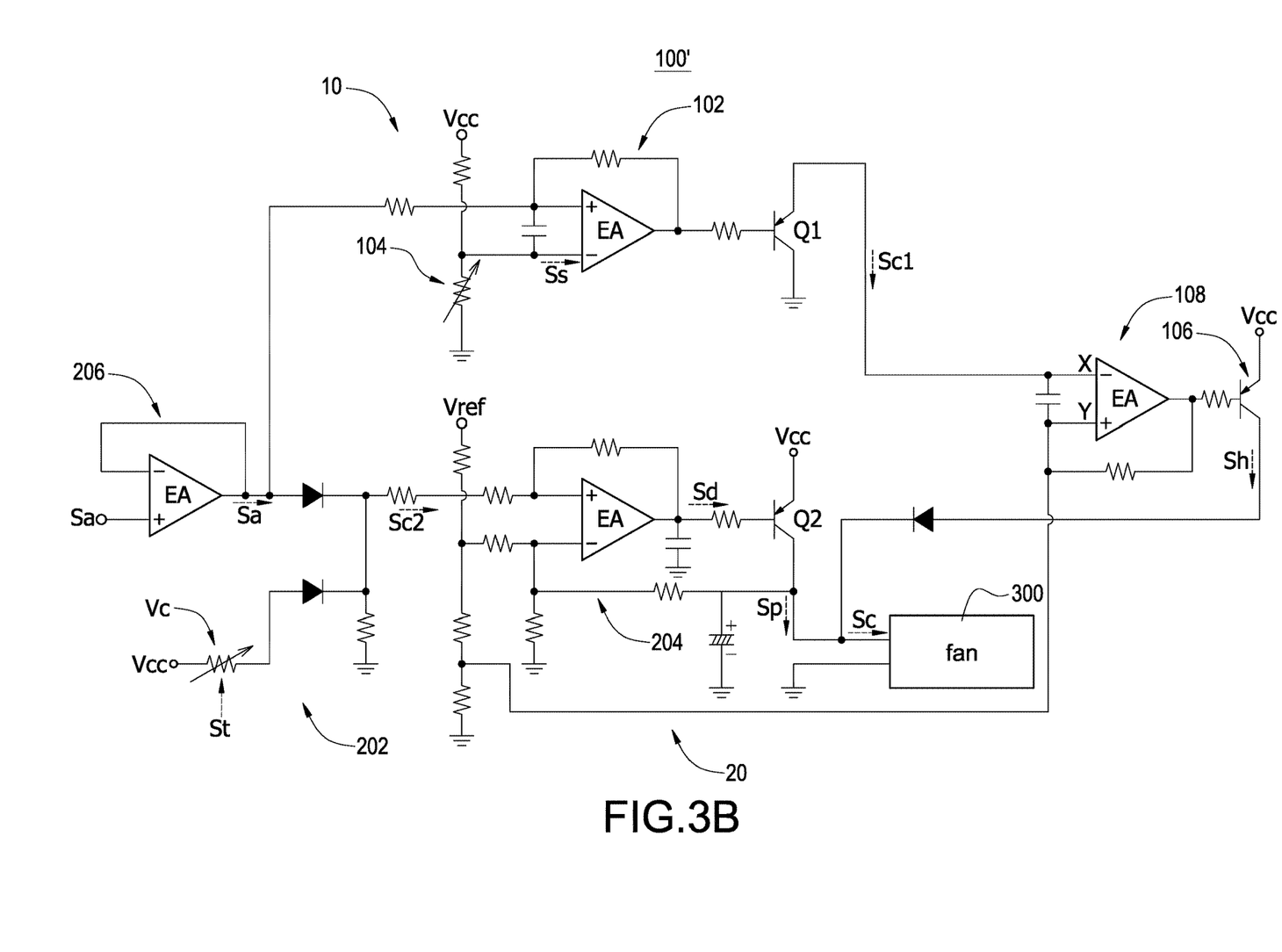
FIG. 3B is a circuit diagram of the fan control circuit with temperature compensation according to a second embodiment of the present disclosure.

Please refer to FIG. 3B, which shows a circuit diagram of the fan control circuit with temperature compensation according to a second embodiment of the present disclosure, also refer to FIG. 1 to FIG. 3A. In this embodiment, the fan control circuit 100' is also a self-design circuit by electronic components, such as general purpose components or integrated circuit components. The difference between the fan control circuit 100' and the fan control circuit 100 of the first embodiment is that the on-off unit 10' of the fan control circuit 100' further includes a hysteresis unit 108. The hysteresis unit 108 is coupled to the start circuit 102 and the switch unit 106, and provides a hysteresis signal Sh to the switch unit 106 according to the first control signal Sc1. The hysteresis signal Sh controls the switch unit 106 to be turned on when the loading V1 is greater than or equal to the start point A1 of the adjustable start thresholds A-C so as to control the fan 300 entering the working mode Mw. The hysteresis signal Sh controls the switch unit 106 to be turned off when the loading V1 is less than the shutdown point A2 of the adjustable start thresholds A-C so as to control the fan 300 entering the standby mode My. In particular, in FIG. 3A and FIG. 3B, the working voltage Vcc may be a voltage value suitable for the normal operation of the circuits, such as 3 volts, 5 volts, 12 volts, or so on. In order to avoid confusion of voltage values, however, both are represented by "Vcc" in FIG. 3A and FIG. 3B. In addition, the components not described in FIG. 3B and the manner of controlling the components are the same as those in FIG. 3A, and the detail description is omitted here for conciseness.

Specifically, the hysteresis unit 108 may be composed of the error amplifier EA. A first end X of the error amplifier EA receives the first control signal Sc1 and a second end Y thereof receives the reference voltage Vref. The error amplifier EA provides the hysteresis signal Sh to the switch unit 106 according to an error (difference) between the first end X and the second end Y so that the switch unit 106 is turned on and turned off to produce a hysteresis effect. After the on-off unit 10 starts the fan 300 to make the fan 300 enter the working mode Mw, if the loading V1 returns to the start point A1 set by the threshold setting unit 104, the fan control circuit 100 does not control the fan 300 to stop and without entering the standby mode My. Until the loading V1 reduces to the shutdown point A2 corresponding to the reference voltage Vref, the fan control circuit 100 controls the fan 300 to stop and to enter the standby mode My. In particular, the curve diagram of the embodiment in FIG. 2B may be implemented using the fan control circuit 100' of FIG. 3B.

In one embodiment, the on-off unit 10 and the speed adjustment unit 20 may respectively include a first unidirectional conduction component D1 and a second unidirectional conduction component D2. In addition, the internal circuits of the hysteresis unit 108 are not limited to the structure shown in FIG. 3B. Any structure of circuit, software, or firmware that can implement the control manner of each unit mentioned above should be included in the scope of this embodiment.

Figure 3C:
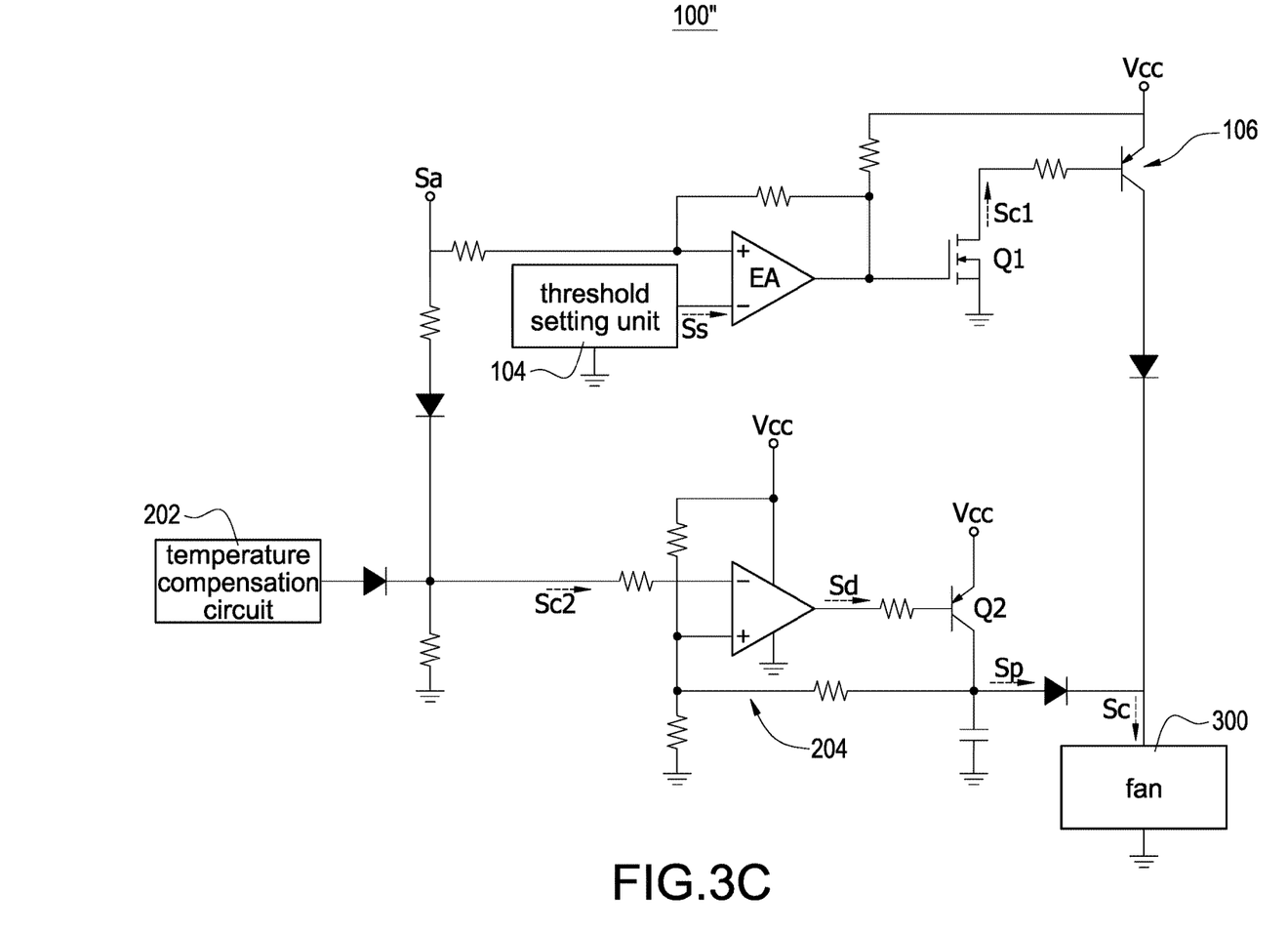
FIG. 3C is a circuit diagram of the fan control circuit with temperature compensation according to a third embodiment of the present disclosure.

Please refer to FIG. 3C, which shows a circuit diagram of the fan control circuit with temperature compensation according to a third embodiment of the present disclosure, and also refer to FIG. 1 to FIG. 3B. In this embodiment, the circuit structure of the fan control circuit 100" and the functions of the components are similar to those of FIG. 3A, but some of the circuits or components of FIG. 3A (for example but not limited to, the voltage follower unit 206) are simplified. The functions and coupling manners of the circuits or components are similar to those in FIG. 3A, and the detail description is omitted here for conciseness.

Please refer to FIG. 1 to FIG. 2B again, when the fan control circuit 100 is a microcontroller controlled by software or firmware, the on-off unit 10 and the speed adjustment unit 20 are an application program composed of software or firmware. The microcontroller realizes the loading V1 of the load 200 according to the load signal Sa and realizes the temperature of the load 200 according to the temperature signal St. The on-off unit 10 sets the adjustable start thresholds A-C for staring the fan 300 through the software or firmware. When the loading V1 is greater than or equal to the adjustable start thresholds A-C, the on-off unit 10 starts the fan 300 so that the fan control circuit 100 provides a PWM signal (i.e., the control signal Sc) with a fixed frequency and a fixed duty cycle to the fan 300 so that the fan 300 enters the fixed-speed mode Mf of the working mode Mw. At this condition, the speed value Sv of the fan 300 is maintained at the first fixed speed S1. The speed adjustment unit 20 sets the speed-adjusting threshold to be the first speed-adjusting threshold B1 according to the time point when the loading departs from the light load. When the loading V1 is less than the first speed-adjusting threshold B1, the on-off unit 10 controls the speed value Sv of the fan 300 to be maintained at the first fixed speed S1. When the loading V1 is greater than the first speed-adjusting threshold B1, the speed adjustment unit 20 controls the fan 300 entering the speed-adjusting mode Ms. When the fan 300 enters the speed-adjusting mode Ms, the speed adjustment unit 20 adjusts the frequency and/or the duty cycle of the PWM signal to adjust the speed value Sv according to the loading V1. Finally, when the loading V1 has increased to the upper limit value Su of the speed value Sv of the fan 300, the fan 300 enters the full-speed mode Mm. At this condition, the frequency and duty cycle of the PWM signal have been adjusted to the upper limit of the system.

When the fan 300 enters the working mode Mw, the speed adjustment unit 20 sets the speed displacement Vs according the temperature of the load 200. The change of the speed displacement Vs corresponds to the change of the temperature of the load 200, and the speed adjustment unit 20 provides the speed displacement Vs to adjust the frequency and/or the duty cycle of the PWM signal to compensate the speed value Sv. When the fan control circuit 100 is a microcontroller controlled by software or firmware, except for the difference in the PWM signal, other control manners are similar to those in FIG. 2A and FIG. 2B, and the detail description is omitted here for conciseness. In addition, since the manner of controlling the speed value Sv of the fan 300 is a voltage control or a PWM control, the type of fan using voltage control and the type of fan using PWM control will also be different.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A fan control circuit with temperature compensation, comprising:
   an on-off unit coupled to a fan, and the on-off unit configured to receive a load signal corresponding to a loading of a load, the on-off unit comprises:
      a start circuit configured to receive the load signal and a start signal, and
      a switch unit coupled to the start circuit and the fan, and
   a speed adjustment unit coupled to the fan, and the speed adjustment unit configured to receive the load signal and a temperature signal corresponding to a temperature of the load, and an output end of the speed adjustment unit coupled to an output end of the on-off unit and the fan,
   wherein the on-off unit is configured to set an adjustable start threshold, and determine that the loading is greater than or equal to the adjustable start threshold according to the load signal to control the fan entering a working mode; in the working mode and when the on-off unit determines that the loading is less than a speed-adjusting threshold, the on-off unit controls the fan entering a fixed-speed mode and maintains a speed value of the fan at a first fixed speed; when the speed adjustment unit determines that the loading is greater than or equal to the speed-adjusting threshold, the speed adjustment unit controls the fan entering a speed-adjusting mode, and the speed adjustment unit adjusts the speed value according to the loading; the speed adjustment unit generates a speed displacement according to the temperature signal, and provides the speed displacement to compensate the speed value when the fan enters the working mode,
   wherein the start circuit determines whether the loading is greater than or equal to the adjustable start threshold to provide a first control signal according to the load signal and the start signal; the switch unit is turned on or turned off by the first control signal to control the fan entering the working mode, and
   wherein when the switch unit is turned on by the first control signal, an input end of the fan receives a working voltage to control the speed value of the fan to be at the first fixed speed, and when a voltage of a speed signal provided by the speed adjustment unit exceeds the working voltage, the speed value of the fan is controlled by the speed signal.

2. The fan control circuit with temperature compensation as claimed in claim 1, wherein the speed adjustment unit sets the speed-adjusting threshold to be a first speed-adjusting threshold, and displaces the speed-adjusting threshold to be a second speed-adjusting threshold according to the speed displacement; in the fixed-speed mode, the speed adjustment unit adjusts the speed value to be a second fixed speed according to the speed displacement; when the speed value is the second fixed speed and the temperature meets the second speed-adjusting threshold, the speed adjustment unit controls the fan entering the speed-adjusting mode.

3. The fan control circuit with temperature compensation as claimed in claim 1, wherein the speed adjustment unit sets the speed-adjusting threshold to be a first speed-adjusting threshold, and displaces the speed-adjusting threshold to be a second speed-adjusting threshold according to the speed displacement; when the fan enters the fixed-speed mode and the temperature meets the second speed-adjusting threshold, the speed adjustment unit controls the fan entering the speed-adjusting mode.

4. The fan control circuit with temperature compensation as claimed in claim 1, wherein the speed adjustment unit comprises:
   a temperature compensation circuit configured to receive the load signal and the temperature signal,
   a speed adjustment circuit coupled to the temperature compensation circuit, and
   a transistor coupled to the temperature compensation circuit and the fan,
   wherein the temperature compensation circuit provides a compensation value to compensate the load signal to be a second control signal according to the temperature signal, the speed adjustment circuit provides a drive signal to the transistor according to the second control signal, and the transistor adjusts the speed value of the fan according to the drive signal.

5. The fan control circuit with temperature compensation as claimed in claim 4, wherein the on-off unit further comprises:
   a hysteresis unit coupled to the start circuit and the switch unit,
   wherein the hysteresis unit provides a hysteresis signal to the switch unit according to the first control signal; the hysteresis signal controls the switch unit to be turned on when the loading is greater than or equal to a start point of the adjustable start threshold so as to control the fan entering the working mode, and hysteresis signal controls the switch unit to be turned off when the loading is less than a shutdown point of the adjustable start threshold so as to control the fan entering a standby mode.

6. The fan control circuit with temperature compensation as claimed in claim 1, wherein the fan control circuit controls the speed value through a control signal, and the control signal is a voltage; in the fixed-speed mode, the start unit controls the voltage to be a fixed voltage to maintain the speed value at the fixed speed; in the speed-adjusting mode, the speed adjustment unit adjusts the voltage according to the loading to adjust the speed value.

7. The fan control circuit with temperature compensation as claimed in claim 1, wherein the on-off unit sets the adjustable start threshold through a threshold setting unit, and the threshold setting unit is one of a variable resistor, a precision variable resistor, a multi-decade voltage divider circuit, a multi-decade comparison circuit, a multi-decade touch switch, a dip switch, and a microcontroller.

8. A method of controlling a fan with temperature compensation, comprising steps of:
   realizing a loading of a load according to a load signal, and realizing a temperature of the load according to a temperature signal,
   setting an adjustable start threshold, and determining whether the loading is greater than or equal to the adjustable starting threshold according to the load signal and a starting signal
   determining that the loading is greater than or equal to the adjustable start threshold, and providing a first control signal to control a switch unit to be turned on, so as to control a fan entering a working mode, controlling the fan entering a fixed-speed mode, and maintaining a speed value of the fan to be at a first fixed speed when in the working mode and the loading is less than a speed-adjusting threshold, controlling the fan entering a speed-adjusting mode, and adjusting the speed value according to the loading when in the working mode and the loading is greater than or equal to the speed-adjusting threshold, and setting a speed displacement according to the temperature, and providing the speed displacement to compensate the speed value when the fan enters the working mode, when the switch unit is turned on by the first control signal, an input end of the fan receives a working voltage to control the speed value of the fan to be at the first fixed speed, and when a voltage of a speed signal exceeds the working voltage, the speed value of the fan is controlled by the speed signal.

9. The method of controlling the fan as claimed in claim 8, further comprising steps of:

setting the speed-adjusting threshold to be a first speed-adjusting threshold, adjusting the speed value to be a second fixed speed according to the speed displacement in the fixed-speed mode, and adjusting the speed value according to the loading, and displacing the speed value according to the speed displacement in the speed-adjusting mode.

10. The method of controlling the fan as claimed in claim 8, further comprising steps of:

setting the speed-adjusting threshold to be a first speed-adjusting threshold, and displacing the speed-adjusting threshold to be a second speed-adjusting threshold according to the speed displacement, and controlling the fan entering the speed-adjusting mode when the fan enters the fixed-speed mode and the temperature meets the second speed-adjusting threshold.

11. The method of controlling the fan as claimed in claim 8, further comprising steps of:

controlling the fan entering the working mode when the loading is greater than or equal to a start point of the adjustable start threshold, and controlling the fan entering a standby mode when the loading is less than a shutdown point of the adjustable start threshold.

12. The method of controlling the fan as claimed in claim 8, wherein a control signal for controlling the speed value is a voltage, and the method of controlling the fan comprises steps of:

controlling the voltage to be a fixed voltage to maintain the speed value at the first fixed speed in the fixed-speed mode, and adjusting the voltage to adjust speed value according to the loading in the speed-adjusting mode.

* * * * *